(12) United States Patent
Den Dekker et al.

(10) Patent No.: US 8,901,703 B2
(45) Date of Patent: Dec. 2, 2014

(54) ELECTRONIC DEVICE

(75) Inventors: Arnoldus Den Dekker, Nijmegen (NL); Johannes Frederik Dijkhuis, Nijmegen (NL); Nicolas Jonathan Pulsford, Nijmegen (NL); Jozef Thomas Martinus Van Beek, Eindhoven (NL); Freddy Roozeboom, Eindhoven (NL); Antonius Lucien Adrianus Maria Kemmeren, Eindhoven (NL); Johan Hendrik Klootwijk, Eindhoven (NL); Maarten Dirk-Johan Nollen, Eindhoven (NL)

(73) Assignee: NXP, B.V., Eindhoven (NL)

(*) Notice: Subject to any disclaimer, the term of this patent is extended or adjusted under 35 U.S.C. 154(b) by 12 days.

(21) Appl. No.: 11/579,679

(22) PCT Filed: May 3, 2005

(86) PCT No.: PCT/IB2005/051433
§ 371 (c)(1),
(2), (4) Date: Nov. 6, 2006

(87) PCT Pub. No.: WO2005/109636
PCT Pub. Date: Nov. 17, 2005

(65) Prior Publication Data
US 2007/0228514 A1 Oct. 4, 2007

(30) Foreign Application Priority Data
May 6, 2004 (EP) .................................. 04101966

(51) Int. Cl.
*H01L 27/08* (2006.01)
*H03H 7/01* (2006.01)
*H03H 3/00* (2006.01)

(52) U.S. Cl.
CPC ............... *H03H 3/00* (2013.01); *H03H 7/0123* (2013.01)

USPC .................... 257/531; 257/656; 257/E27.001

(58) Field of Classification Search
USPC .................................. 257/531, 656, E27.001
See application file for complete search history.

(56) References Cited

U.S. PATENT DOCUMENTS 4,474,623 A * 10/1984 Adlerstein .................... 438/412
4,810,980 A *  3/1989 Heston et al. ................ 333/17.2

(Continued)

FOREIGN PATENT DOCUMENTS

CN          1232299 A      10/1999
CN          1328346 A      12/2001

(Continued)

OTHER PUBLICATIONS

Wolf S. et al "Silicon Processing for the VLSI Era" (Sunset Beach: Lattice Press, 2000), pp. 258-259.

*Primary Examiner* — Tucker Wright

(57) ABSTRACT

The electronic device comprises a network of at least one thin-film capacitor and at least one inductor on a first side of a substrate of a semiconductor material. The substrate has a resistivity sufficiently high to limit electrical losses of the inductor and being provided with an electrically insulating surface layer on its first side. A first and a second lateral pin diode are defined in the substrate, each of the pin diodes having a doped p-region, a doped n-region and an intermediate intrinsic region. The intrinsic region of the first pin diode is larger than that of the second pin diode.

16 Claims, 3 Drawing Sheets

(56) References Cited

U.S. PATENT DOCUMENTS

| | | | |
|---|---|---|---|
| 5,280,194 A | 1/1994 | Richards et al. | |
| 6,043,553 A | 3/2000 | Suzuki | |
| 6,049,109 A | 4/2000 | Omura et al. | |
| 6,348,718 B1 * | 2/2002 | Leipold et al. | 257/379 |
| 6,538,874 B2 | 3/2003 | Pulsford et al. | |
| 6,555,848 B2 | 4/2003 | Yoshitake | |
| 6,949,812 B2 | 9/2005 | Losehand et al. | |
| 2002/0074605 A1 | 6/2002 | Gamand et al. | |
| 2002/0100950 A1 * | 8/2002 | Babcock et al. | 257/461 |
| 2003/0170950 A1 * | 9/2003 | LaFleur | 438/240 |
| 2004/0094815 A1 * | 5/2004 | Park et al. | 257/419 |
| 2004/0119130 A1 * | 6/2004 | Peichl et al. | 257/458 |

FOREIGN PATENT DOCUMENTS

| | | |
|---|---|---|
| EP | 0762500 A1 | 3/1997 |
| EP | 0929113 A2 | 7/1999 |
| GB | 2228616 A | 8/1990 |
| JP | 2003234411 A | 8/2003 |
| JP | 2003530689 A | 10/2003 |
| JP | 2004014658 A | 1/2004 |
| JP | 2004088012 A | 3/2004 |
| JP | 2007231072 A | 9/2007 |
| JP | 2009214278 A | 9/2009 |
| JP | 10284694 A | 12/2010 |
| JP | 11251802 A | 12/2011 |
| WO | 2004036778 A1 | 4/2004 |
| WO | 2005008908 A1 | 1/2005 |

* cited by examiner

ELECTRONIC DEVICE

The invention relates to an electronic device comprising a network of thin-film capacitors and inductors on a first side of a substrate of a semiconductor material, the substrate having a resistivity sufficiently high to limit electrical losses of the inductor and being provided with an electrically insulating surface layer on its first side.

Such an electronic device is known from U.S. Pat. No. 6,538,874. The known electronic device is a network having a first and a second electrically conductive layer, between which a dielectric layer and an insulating layer are present.

The insulating layer herein acts as a spacer and is provided with a contact window through which an electrode of the capacitor can be connected. The second conductive layer is present adjacent to this insulating layer and preferably has a thickness larger than a penetration depth at the operation frequency. For RF frequencies of 100 MHz to 3 GHz and with the use of Al or Al alloys, this thickness is at least one μm.

The first conductive layer is present on the opposite side of the dielectric layer. Herein a capacitor electrode and interconnects are defined. An additional and intermediate conductive layer may be present in which the other capacitor electrode is defined. This known electronic device is primarily meant for impedance matching.

It is a drawback of the known device, that it needs to be combined with discrete semiconductor elements that are used as switches. Therewith, still a number of components need to be assembled on a carrier and the advantage of an integrated network is limited.

It is therefore an object of the invention to provide an electronic device of the kind mentioned in the opening paragraph, in which switches can be integrated within the network and still the network is suitable for use at high frequencies, particularly in RF applications.

This object is achieved in that a first and a second lateral pin diode defined in the substrate, each of the pin diodes having a doped p-region, a doped n-region and an intermediate intrinsic region. The intrinsic region of the first pin diode is larger than that of the second pin diode.

According to the invention lateral pin diodes are used as the switches. The lateral pin diodes have a differently sized intrinsic region. This is a substantial advantage, as it allows to design the pin diodes in accordance with the desired application, so that the performance is sufficient to meet the requirements.

Although lateral pin diodes are already known, there is a problem with their integration in view of electrical effects generated in the substrate. These effects are referred to as crosstalk between the pin diodes. Such crosstalk occurs over large distances, particularly in view of the high-ohmic characteristic of the substrate, which does not hamper in any way the construction of an electric field through the substrate. In a preferred embodiment of the invention, there are means for suppressing said crosstalk. It is observed that for some applications, such as a conventional antenna switching circuit, the crosstalk per se is not the major problem; both pin diodes are simultaneously switched off or on. In such a switching circuit, there is provided a transmission line of a quarter wavelength ($\lambda/4$) between the two pin-diodes. The substrate effects may give rise to a parasitic path through the substrate, particularly to ground or to the second pin diode. The presence of such a path leads to a deviation of the $\lambda/4$-length, and hence deteriorated transmission of the signal.

The means for suppressing the crosstalk can be embodied in different manners. First of all, a shielding layer or region may be provided between the first and the second pin diode. The shielding layer can be a buried layer in the substrate, substantially parallel to the substrate surface. Such buried layer is preferably highly insulating, such as an oxide or an oxynitride layer. The shielding layer can alternatively be a region substantially transversal to the substrate face. It could surround the pin diode laterally, and could be made through etching of pores with a dry-etching or wet-etching technique. Such pores are preferably filled for processing reasons. The shield can be electrically insulating, but also electrically conductive and connected to ground.

In a first preferred embodiment the means for suppressing crosstalk comprise an isolation of a substrate portion in which the first pin diode is defined. This isolation comprises both a buried layer in the substrate and a ring-shaped side wall extending from the buried layer to the substrate surface, so that said substrate portion is substantially electrically insulated from other substrate portions. This combination of shielding layers to form insulation of a cavity portion appears highly advantageous for shielding reasons. It can nevertheless be manufactured without the need for an expensive substrate with an insulating layer that is present everywhere. This is achieved in that the buried layer is provided locally by means of an implantation step, while the ring-shaped side wall is provided by filling pores. It will be understood that it is highly preferred for each pin diode to be provided with such an isolation that the bulk of the substrate is kept substantially free of any charge carriers originating from the pin diodes.

In a first modification, the buried layer is a silicide, which is provided by implantation of a suitable element, such as molybdenum, titanium or cobalt. In a subsequent heating step, which may be combined with other heating steps, or could possibly be effected by irradiation, a solid-state reaction is made to occur so as to form the silicide. Such a silicidation can be done before or after the formation of the pin diode. It provides a very good protection against very high frequencies. Preferably, the pores comprise an electrically conducting material, so as to have a full electromagnetic shield. A suitable material is, for instance, polysilicon, which could be enhanced by electroplating.

In a second modification, the buried layer is an oxide, which is provided by implantation. The buried layer is preferably a 'SIMOX'-layer, which abbreviation stands for Separation by Implanted Oxygen. The SIMOX-layer results in a very thin insulating layer just below a thin layer of silicon. The insulating layer is smooth and features virtually no imperfections or impurities while retaining high yield rates. The provision of a SIMOX layer is known per se from S. Wolf and R. N. Tauber, *Silicon Processing for the VLSI Era*, (Sunset Beach: Lattice Press, 2000), 258-259. The pores are herein preferably filled with electrically insulating material to form the side walls. A suitable filling material is, for instance, a stack of an oxide, nitride and an oxide layer.

In an even further embodiment, the substrate comprises additional pores to define vertical trench capacitors and/or vertical interconnects through the substrate. Vertical trench capacitors are adequate to provide a high-density capacity against low costs. In this manner, the trench capacitors can be produced in the same manufacturing step as said side wall. In view of process compatibility, the side walls will comprise an electrically conducting material in this case.

It is preferred, however, that the means for suppressing crosstalk are provided randomly or uniformly in the substrate. A first embodiment hereof is that defects to the crystal lattice are created by irradiation with beams of electromagnetic radiation or particles. Suitable beams include beams of electrons, particularly high-energy electrons, neutrons and ions. This embodiment has the additional advantage that the equivalent series resistance of the capacitors is reduced. A second embodiment thereof is the use of embedded conductive particles such as Au, Pt, Ni or the like.

It is furthermore observed that these means may be used in combination. Particularly preferred as additional means is the use of ion implantations at the substrate surface, such as those of Ar, N, He. The implantation is provided after growing the thermal oxide and before deposition of the first conductive layer. Its result may be an amorphisation of the substrate at the interface with the oxide layer. The implantation is suitable as additional means, in that it acts as recombination center for ions originating from the pin-diode.

In a further embodiment, the pin diodes have a substantially circular or oval shape in a cross section parallel to the substrate surface. Particularly the circular shape has the advantage that the width of the intrinsic region is well defined. It is another advantage that the pin diode as a whole can be suitably insulated from other parts of the device. It is generally considered that the size of circular shaped pin diodes is larger than pin diodes with corresponding properties in a layout with interdigitated electrodes. However, the size is not of major importance in the device of the invention comprising the capacitors and inductors.

In a particularly suitable modification hereof the n-doped region is laterally present within the intrinsic region. This is the preferred option for a substrate that is generally n-doped.

In another preferred modification the oval or circular shape is provided with a gap. An interconnect for interconnecting an inner region of the pin diode is located such that on perpendicular projection of the interconnect on the substrate surface it has a substantial overlap with the gap. It has turned out, surprisingly, that the gap in the oval or circular shape does not affect the properties of the pin diode negatively. At the same time, this gap is beneficial to reducing the parasitic capacity between the interconnect and the outer regions.

In a further embodiment, the network has an insulating layer which acts as a spacer. This embodiment is that of the prior art. It is particularly beneficial in that any interconnects can be provided in the second conductive layer, which has sufficient thickness to limit the resistivity thereof. Thus, the distance between a pin diode and another component can be chosen so as to optimize the design, while the inductive losses are very low. In an even further embodiment, the first conductive layer comprises a ground plane such that interconnects in the second layer have a transmission line character. This even further improves the RF behavior of the electronic device.

The electronic device of the invention is very suitable for use as a combined antenna impedance matching and antenna switch. This is due to several reasons: first of all, the amount of assembly is very limited due to the integration scale. Then, interconnects can be designed as a whole and suitable for RF applications. Furthermore, the antenna switches have a differently sized intrinsic region.

The device of the invention is very suitable for use at frequencies of about 100 MHz and higher. They may be used in mobile phone handsets, but also in basestations. The device of the invention can be used as an interposer substrate as well, on top of which further devices are assembled.

For the receive path of the antenna switches, a very large insulation is needed to prevent any signals from being amplified by a power amplifier on the receive path and causing breakdown of the low-noise amplifier. The intrinsic region can thus be larger, for instance 5-25 µm and preferably 8-10 µm. For the transmit path, it is important that the resistance is limited, so as to limit the losses of the signal that has been amplified already. The intrinsic region of the pin diode in the transmit path has thus a small width, for instance 0.1-10 µm, and preferably 1-3 µm. These widths refer to those in the device, which may be smaller than the widths on the mask used in the manufacturing as a consequence of diffusion through the substrate.

It is furthermore advantageous, that the first and the second pin diode are connected in series. Such a connection is a different embodiment than the one sketched above, although such construction may be applied within one path.

The advantage of this embodiment as compared to a parallel switching of the pin diodes is the small impedance losses. Nevertheless—and this is different from vertical pin diodes placed in series on a single substrate—the scalability offers that the pin diodes connected in series may be given different characteristics. In vertical pin diodes on a single substrate, all intrinsic regions have the same width.

The substrate of the device of the invention can be made thinner. Furthermore, active devices may be placed in cavities within the substrate. The conducting layers can then act as interconnects to such devices as well. In addition, a heat sink can be provided on the back of the substrate, preferably of the thinning thereof, so as to remove any superfluous heat. This heat sink is suitable as a ground plane at the same time. Contact pads for the preferable, placement of bumps, or wirebonds can be provided in the second conductive layer.

The resistance, which is sufficiently high to limit electrical losses of the inductor, is generally a resistance of more than 100 Ω.cm and preferably of at least 1 kΩ.cm. Although it is preferred that the substrate is overall high-ohmic, this is principally not necessary, and the high-ohmic character may be limited to certain regions.

Within the stack of layers on top of the substrate, including the conductive layers, the dielectric layer and the spacer, further components may be defined. They include transmission lines, micro-electromechanical system (MEMS) switches and variable capacitors, varactors, resistors and resonators. This allows use of the substrate as a platform and a carrier on which a variety of functions can be integrated, including one or more low-noise amplifiers and power amplifiers, a transceiver IC, a voltage-controlled oscillator and any interconnects and additional components needed for matching, coupling, feedback-loops and whatever. The stack of layers is particularly suitable for integration of a MEMS element, in that this is realized by providing a patterned sacrificial layer beneath the second conductive layer, that is after provision of this second conductive layer is removed by etching.

These and other aspects of the device of the invention will be further explained with reference to the Figures, in which.

Figure 1:
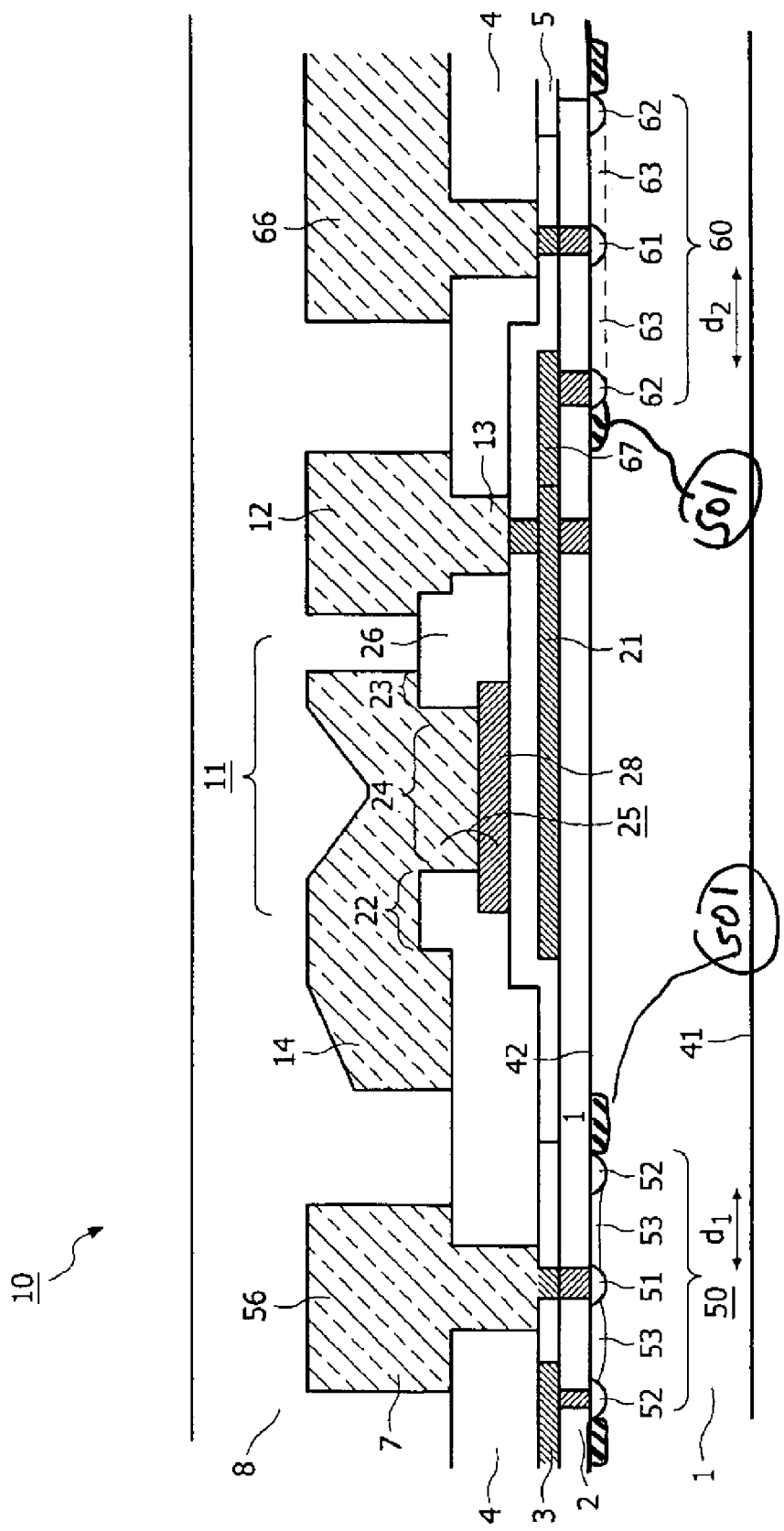
FIG. 1 shows a diagrammatic cross-sectional view of the device in a first embodiment.

FIG. 1 shows a diagrammatical cross-sectional view of the device. The electronic device 10 comprises a substrate 1 of silicon with a first side 41 and a second side 42. On the second side 42, the substrate 1 is covered with an electrically insulating layer 2 of silicon oxide. A first electrically conducting layer 3 of Al, in which a first capacitor electrode 21 of the first capacitor 11 is defined, is present on the layer 2. A layer of dielectric material 5, which is removed in the area of the via 13, lies on the first electrically conducting layer 3. The layer of dielectric material 5 comprises $SiN_x$, $0.5 \le x \le 2$, and constitutes the dielectric 26 in a middle zone 24 of the capacitor 11. In the edge zones 22 and 23, the dielectric 26 comprises not only the layer of dielectric material 5 but also a layer of electrically insulating material 4, in this example $SiO_x$, $1 \le x \le 2$. An intermediate layer 6 comprising Al lies on the layer of dielectric material 5 and is partly covered by the layer of electrically insulating material 4. A conductor track 28 is defined in the intermediate layer 6. A second pattern 29 of a second electrically conducting layer 7, also comprising Al, is in electrical contact with this conductor track 28. The conductor track 28 and the second pattern 29 together form the second capacitor electrode 25 of the first capacitor 1. The second conducting layer 7 in addition comprises a first coil 12 as a first pattern, a via 13, and an interconnect 14, and is covered with a protective layer 8. A perpendicular projection of the second pattern 29 onto the intermediate layer 6 lies partly outside the conductor track 28. A perpendicular projection of the second pattern 29 onto the first conducting layer 3 lies partly outside the first capacitor electrode 21, i.e. in the area of the interconnect 14. This interconnect 14 is necessary for connecting the second capacitor electrode 25 to other parts of the device 110. Hence, a perpendicular projection of the second capacitor electrode 25 onto the first conducting layer 3 lies at least partly inside the first capacitor electrode 21.

In accordance with the invention, the device 10 comprises a first lateral pin diode 50 and a second lateral pin diode 60. Both pin diodes 50, 60 have in this embodiment a circular shape, with the first n-doped region 51,61 laterally located within the second p-doped region 52, 62. Between the n-doped region 51,61 and the p-doped region 52,62 an intrinsic region 53, 63 is provided. According to the invention, the width d1 of the intrinsic region 53 of the first pin diode 50 is smaller than the width d2 of the intrinsic region 63 of the second pin diode. As a result, the first pin diode 50 has a lower resistance than the second pin diode 60. Hence the first pin diode 50 is very suitable for integration in a transmit path of a mobile phone, whereas the second pin diode 60 is suitable for integration in its receive path. In order to prevent crosstalk, the substrate 1, which is suitably high-ohmic, includes means for prevention of crosstalk 501. As initial measurements have shown, lateral pin diodes in which the intrinsic region has a width of 8 um have a resistance in the order of 3-6Ω. at a current of 1 mA and a frequency of 100 MHz., which resistance decreases when the current is increased to 0.3-0.6OMEGA. at 10 mA. The insertion loss is smaller than −1.5 dB for frequencies around 700 MHz, also at low currents. The breakdown voltage is between 20 and 30 V.

As is clear from FIG. 1 the lateral pin diodes 50,60 have the clear advantage that they can be contacted from the top. Interconnects 56, 66, 67 can thus be integrated in the first and second conductive layers 3, 7. Through the interconnects 56,66,67, the pin diodes can be integrated in a circuit, as will be clear to the skilled person. Embodiments hereof are for instance known from the non-prepublished applications EP03102255.1 (PHNL030882) and EP02079324.6 (PHNL020986), which are included herein by reference. The actual layout as shown, in which the inductor 12 and capacitor 11 are laterally present between the pin diodes 50, 60 is only exemplary. Other layouts may be designed as well. An example hereof is that the inductor and the pin diodes are laterally spaced apart, and that only the substrate region under or in the direct vicinity of the inductor and the capacitor is made highly-ohmic. Furthermore, the second conductive layer 7 is shown to have a large thickness. However, by choosing an alternative metal such as Cu, this thickness can be reduced.

Figure 2:
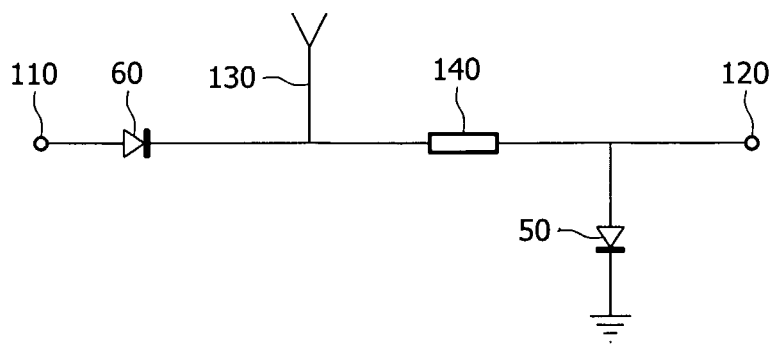
FIG. 2 shows an electrical diagram of a circuit with two pin diodes.

FIG. 2 shows an electrical diagram, which is a representation of a circuit with the pin diodes for use in an antenna switch. Shown is a circuit for one frequency band only. The circuit comprises a connection 110 to a transmit path with a power amplifier; a connection 120 to a receive path with a low-noise amplifier; and a connection to the antenna 130. Furthermore, a resonating transmission line 140 of quarter wavelength λ/4 is provided, as well as the first pin diode 50, which is positioned between the connection to the receive path 120 and ground; and a second pin diode, which is positioned between the transmit path 110 and the connection to the antenna 130. In case the signals from the transmit path 110 have to be sent to the antenna 130, the pin diodes 50, 60 are switched on. Alternatively, in the receive mode, the pin diodes 50,60 are switched off.

Figure 3:
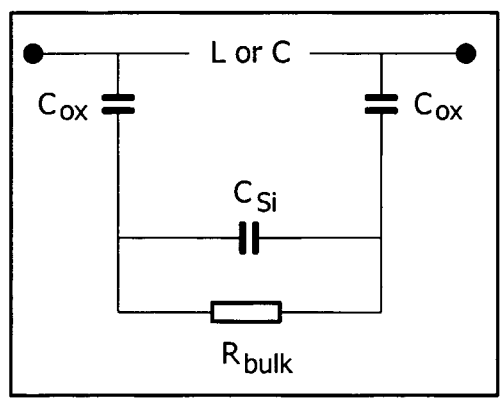
FIG. 3 shows an electrical diagram of a circuit of an inductor and a capacitor on a high-ohmic substrate.

FIG. 3 shows an electrical diagram, which is a model for the electrical losses in the substrate. From this model it can be understood that for capacitors substrate losses are dominating at low frequencies, whereas for inductors losses start to dominate at high frequencies. The substrate-induced losses can be split up into bulk-induced losses and losses which are induced at the Si—$SiO_2$ interface. Under zero-bias conditions an accumulation layer exists at the Si—$SiO_2$ interface, induced by e.g. fixed charge normally present in thermal silicon oxide. From CV measurements it is deduced that the amount of accumulated charge is about an order of magnitude larger that the total amount of mobile charge present in the bulk of 4 kΩcm Si. Therefore, it is clear that, next to the bulk resistance, the interface resistance associated with this accumulated charge significantly influences the loss of the passives processed on top. The low resistance at the Si—$SiO_2$ interface can be increased by making the top surface of the Si substrate amorphous, thereby decreasing the carrier mobility. In our case, this is achieved using ion implantation of e.g. Ar or N after growth of the thermal oxide and before deposition of the first conductive layer 3.

Figure 4:
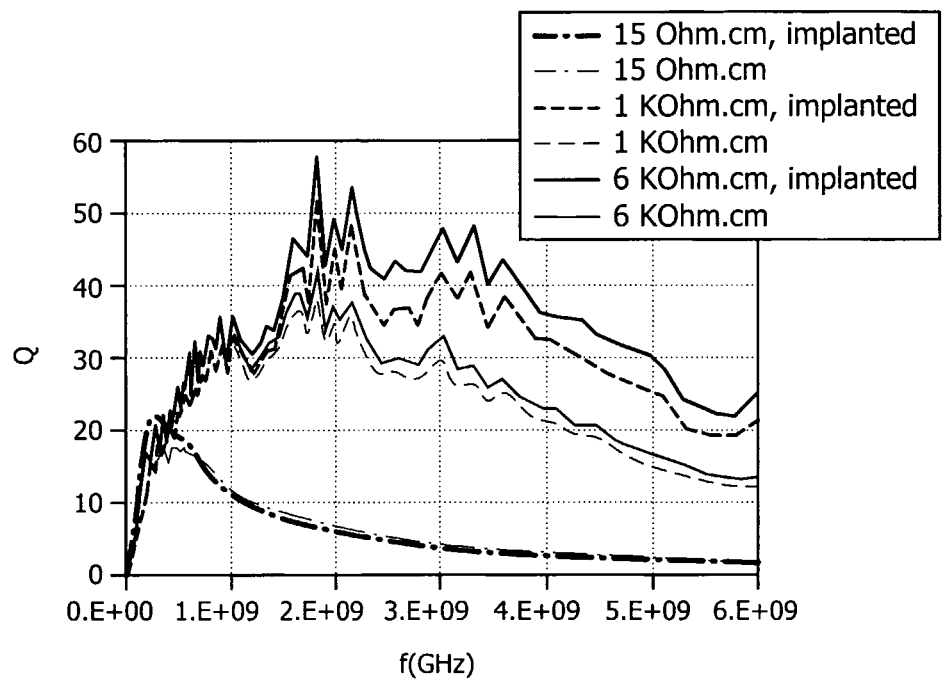
FIG. 4 shows the relationship between the Q-factor of an inductor as a function of the frequency for substrates of various resistivity.

FIG. 4 shows a graph of the Q-factor of a 5 nH inductor as a function of the substrate resistance. It can be seen that a significant improvement of inductor Q is obtained for the high-ohmic Si (ρ-4 kΩ.cm) used in the present invention. The increase in inductor Q is almost absent for bulk resistivities <1 kΩ.cm. For substrate resistivities below 1 kΩcm the bulk-induced losses clearly dominate the losses that are induced at the Si—$SiO_2$ interface.

A further suppression of substrate losses is achieved though the introduction of lattice defects in the bulk. By creating localized energy states within the band-gap of Si mobile charge is trapped and, as a result, the specific resistivity is increased. Permanent damage to the crystal lattice may be caused when using high-energy (E>1 MeV) beams of electro-magnetic radiation or particles such as ions, and neutrons. The irradiation is a low-temperature process and can therefore be carried out after the stack of layers 3,4,5,7 is deposited and structured. A Van-de-Graaf accelerator is used which produces an electron energy of 1-5 MeV. Processed wafers are irradiated with a dose of $1.4 \times 10^{15}$ e.cm$^{-2}$.

Figure 5:
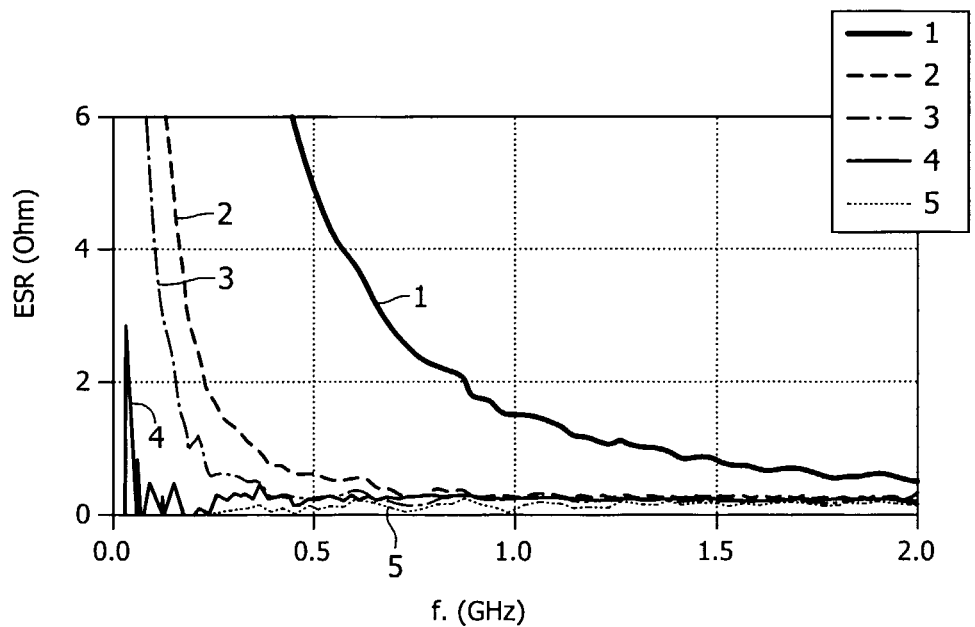
FIG. 5 shows the relationship between the series resistance of a capacitor as a function of the frequency for substrates of various resistivities.

FIG. 5 shows a graph of the equivalent series resistance (ESR) of the capacitor 11 as a function of the frequency for substrates that have received different treatments. The dotted line indicates the untreated device, the dashed line indicates the device treated with irradiation. The dash-and-dot line indicates the device treated with implantation. The dash-dot line indicates the device treated with both implantation and irradiation. For comparison, the ESR is plotted of the same capacitor processed on a glass substrate, which is shown as a continuous line. From this FIG. 5 it can be seen that the ESR after e-beam irradiation has reduced by about the same magnitude as is achieved using interface ion-implantation. The ESR is further lowered when combining the e-beam irradiation with the interface ion-implantation. As expected, this clearly shows that the irradiation is complementary to the implantation. Fitting these data with the model depicted in FIG. 3 shows that the effective substrate resistance is increased by a factor of 10,000 (!) as compared to "untreated" highly-ohmic silicon. After e-beam irradiation the leakage current of the capacitor 11 has not changed significantly.

The invention claimed is:

1. An electronic device comprising a network of at least one thin-film capacitor and at least one inductor on a first side of a substrate of a semiconductor material, the substrate having a resistivity sufficiently high to limit electrical losses of the inductor and being provided with an electrically insulating surface layer on its first side; wherein a first and a second lateral pin diode are defined in the substrate, each of the pin diodes having a doped p-region, a doped n-region and an intermediate intrinsic region arranged laterally between the doped p-region and the doped n-region of each pin diode, and of which pin diodes the intrinsic region of the first pin diode having a larger width than that of the second pin diode, and a resistance of the first pin diode is larger than a resistance of the second pin diode; and wherein a crystal lattice of the substrate includes crosstalk-mitigating lattice defects created by irradiation of the substrate, the crosstalk-mitigating lattice defects being an amorphisation of the substrate and being configured to act as a recombination region for ions originating from one of the pin diodes to prevent crosstalk between the first pin diode and the second pin diode; and wherein an external input is connected to an anode of the second pin diode and the first and second pin diodes are connected in series in a same anode-cathode orientation without a further pin diode connected between the first and second pin diodes.

2. An electronic device as claimed in claim 1, wherein the substrate is provided with means for preventing crosstalk between the first and the second pin diode.

3. An electronic device as claimed in claim 2, wherein the means for preventing crosstalk comprise an isolation of a substrate portion in which the first pin diode is defined, which isolation comprises a buried layer in the substrate.

4. An electronic device as claimed in claim 2, wherein the crosstalk-mitigating lattice defects in the substrate are created by irradiating the substrate by beams of electromagnetic radiation in particles.

5. An electronic device as claimed in claim 2, wherein the means for preventing cross talk comprise electrically conductive particles.

6. An electronic device as claimed in claim 1, wherein the first pin diode has a substantially circular or oval shape in a cross section parallel to the substrate surface.

7. An electronic device as claimed in claim 6, wherein the doped n-region is laterally present inside the intrinsic region.

8. An electronic device as claimed in claim 6, wherein the circular or oval shape is provided with a gap, and wherein an interconnect for connecting a region of the first pin diode is located such that on perpendicular projection of the interconnect on the substrate surface there is a substantial overlap with the gap.

9. An electronic device as claimed in claim 1, wherein the at least one inductor and the capacitor are embedded in a stack comprising a first and a second electrically conductive layer and a dielectric layer and an insulating layer there between, said insulating layer acting as a spacer and comprising contact windows for connecting an electrode of the capacitor.

10. An electronic device as claimed in claim 1, wherein the first pin diode is arranged in a receive path of an antenna switch, and the second pin diode is arranged in a transmit path of an antenna circuit.

11. An electronic device as claimed in claim 1, wherein the substrate is silicon and the substrate has a resistivity greater than or equal to 4 k$\Omega$.cm.

12. The electronic device of claim 1, wherein the lattice defects are located within an Si bandgap of the substrate, and configured and arranged with localized energy states.

13. The electronic device of claim 1, wherein the lattice defects are configured and arranged with ion implants at the substrate surface.

14. The electronic device of claim 1, wherein the lattice defects are configured and arranged with embedded conductive particles in the substrate.

15. The electronic device of claim 1, wherein a portion of the substrate containing the lattice defects has an effective resistance that is greater than the substrate by a factor of 10,000 compared to untreated high-ohmic silicon.

16. The electronic device of claim 1, wherein the lattice defects of the crystal lattice are defined by permanent radiation damage.

* * * * *